United States Patent
Lee et al.

[11] Patent Number: 6,088,170
[45] Date of Patent: Jul. 11, 2000

[54] OPTICAL SYSTEM FOR SHAPING LIGHT BEAMS AND AN OPTICAL PICKUP EMPLOYING THE SAME

[75] Inventors: Chul-Woo Lee; Pyong-Yong Seong, both of Seoul; Tae-Kyung Kim, Suwon, all of Rep. of Korea

[73] Assignee: Samsung Electronics Co., Ltd., Suwon, Rep. of Korea

[21] Appl. No.: 09/014,625

[22] Filed: Jan. 28, 1998

Related U.S. Application Data

[60] Provisional application No. 60/036,844, Feb. 3, 1997.

[30] Foreign Application Priority Data

Jan. 28, 1997 [KR] Rep. of Korea ............. 97-2498

[51] Int. Cl.⁷ .............. G02B 13/18; G11B 7/00
[52] U.S. Cl. ......................... 359/710; 369/112
[58] Field of Search .................... 359/208, 710; 369/100, 112, 121, 44.23, 44.24

[56] References Cited

U.S. PATENT DOCUMENTS

| | | | |
|---|---|---|---|
| 4,795,244 | 1/1989 | Uehara et al. | 356/401 |
| 5,568,259 | 10/1996 | Kamegawa | 356/373 |
| 5,710,418 | 1/1998 | Tawara | 235/472 |
| 5,771,219 | 6/1998 | Miyamoto | 369/112 |
| 5,781,519 | 7/1998 | Ishika et al. | 369/58 |
| 5,784,203 | 7/1998 | Beckmann | 359/618 |

FOREIGN PATENT DOCUMENTS

| | | |
|---|---|---|
| 03 10 711 A1 | 4/1989 | European Pat. Off. . |
| 33 05 675 C2 | 9/1983 | Germany . |
| 60-241013 | 11/1985 | Japan . |
| 61-202339 | 9/1986 | Japan . |
| 62-62441 | 3/1987 | Japan . |
| 2-257115 | 10/1990 | Japan . |
| 4-351728 | 12/1992 | Japan . |
| 5-62238 | 3/1993 | Japan . |
| 5-333286 | 12/1993 | Japan . |
| 6-274931 | 9/1994 | Japan . |

Primary Examiner—Georgia Epps
Assistant Examiner—Jordan M. Schwartz
Attorney, Agent, or Firm—Staas & Halsey LLP

[57] ABSTRACT

A beam-shaping optical system includes a light source, a plurality of plates, and a cylindrical lens disposed between the light source and the plurality of plates, wherein the plurality of plates and the cylindrical lens have an optical feature in which the light output from the light source is beam-shaped to have a desired shape in the cross-section of the light beam. An optical pickup using the beam-shaped light which is diverged by the optical system can obtain convergence light reflected from an optical storage medium. Since the convergence light transmitted through only one plate has astigmatism as it is, a separate lens is not used for light detection and uses a photo detector adapted for employing an astigmatic method, to perform a focussing servo.

45 Claims, 3 Drawing Sheets

SMALL BEAM DIAMETER: -----
LARGE BEAM DIAMETER: ———

OPTICAL SYSTEM FOR SHAPING LIGHT BEAMS AND AN OPTICAL PICKUP EMPLOYING THE SAME

This application claims priority of provisional application No. 60/036,844, filed Feb. 3, 1997.

BACKGROUND OF THE INVENTION

1. Field of the Invention

The present invention relates to an optical system for shaping light beams and an optical pickup employing the same, and more particularly, to an optical system for shaping a light beam output from a light source into a desired form and an optical pickup employing the same.

2. Description of the Related Art

An optical pickup for an optical storage medium, such as a compact disk (CD) and a digital versatile disk (DVD), uses a laser source for outputting a light beam having an elliptical cross-section. The laser source outputs light generated by an active layer of a laser diode in the form of a divergent beam. Referring to FIG. 1, generation of the laser light is briefly explained.

FIG. 1 shows an elliptical light beam output from a laser diode. In FIG. 1, a direction of a junction surface in the laser diode, that is, a direction parallel with an active layer is expressed as "∥" and a direction perpendicular to the junction surface is expressed as "⊥". Here, the direction "⊥" coincides with the direction of current flowing through the active layer in the laser diode. In the case of a laser diode (Model No. PS010-00 manufactured by Blue Sky Research), an active layer region has a size of 1 μm (direction ⊥)×3 μm (direction ∥) centered at a point B shown in FIG. 1. The laser light is generated from the active layer region. Since the light output through the active layer region starts at two different points A and B, the output light has astigmatic distance ΔZ representing a distance between the points A and B. A divergence angle of the laser light is generally 20~40° in case of $\theta_\perp$ and 8~20° in case of $\theta_\parallel$, and thus, the output light beam has an elliptical cross-section with respect to the optical axis. Particularly, the long axis having a large beam diameter coincides with the direction ⊥ and the short axis having a small beam diameter coincides with the direction ∥ parallel with the junction surface.

However, since an objective lens for a light storage medium is circular, a light beam having a circular cross-section is needed to enhance a light utilization efficiency. The conventional beam shaping methods proposed by this need are described below with reference to FIGS. 2A through 4.

The optical system shown in FIGS. 2A and 2B includes two cylindrical lenses 11 and 12. FIG. 2A shows the lenses 11 and 12 viewed from the plane coincident with the direction ∥ and FIG. 2B shows the lenses 11 and 12 viewed from the plane parallel with the direction ⊥. The lenses 11 and 12 have a different focal length, respectively. The diverging light beam output from the laser source as referred in FIG. 1, is collimated by a collimating lens (not shown) and then is incident to the lens 11. The lens 11 has a plano-concave shape at the direction coincident with the direction ∥, to accordingly diverge the light incident thereto in parallel with the direction ∥. The lens 11 transmits the light incident in parallel with the direction ⊥ without refraction. The light output from the lens 11 is incident to lens 12. The lens 12 outputs the light incident from the plano-concave lens 11 in parallel with the direction ∥ in the form of substantially parallel light. The light incident at the direction parallel with the direction ⊥ is transmitted without refraction via the lens 12, to accordingly keep it substantially parallel light. Thus, at the direction parallel with the direction ∥ shown in FIG. 2A, the incident light having a beam diameter Wi is changed into that having a larger beam diameter Wo. As a result, the elliptical light beam output from the laser source is shaped into the light beam having a substantially circular cross-section.

FIG. 3 shows a conventional beam shaping prism 21. A light beam incident to the prism of FIG. 3 is a light beam elliptically output from a laser source and then collimated by a collimating lens, as in FIGS. 2A and 2B. The collimated light beam is incident to a surface 23 of the prism 21. At the incident plane shown in FIG. 3, the light beam of the small diameter direction having an incident angle $\theta_i$ is refracted by a refractive angle $\theta_o$ by the prism 21 having a refractive index n and then is output from the surface 25. The prism 21 changes the diameter Wi of the light beam incident to the incident plane of FIG. 3 into a larger diameter Wo. However, the prism 21 does not nearly change the beam diameter of the light incident to another incident plane perpendicular to the incident plane. Thus, the light beam output from the surface 25 becomes substantially circular.

FIG. 4 shows a conventional optical system for shaping a beam using a micro-lens 42. The light output from an active layer 41 has an elliptical cross-section as described above referring to FIG. 1. The light is incident to the micro-lens 42 distant by several micrometers from the active layer 41. The micro-lens 42 has an optical feature in which the light incident with respect to the small diameter direction as shown in FIG. 4 as dotted lines is transmitted without being substantially refracted. However, with respect to the large diameter direction shown as a solid line, the micro-lens 42 refracts the incident light via a convex surface 421 to become substantially parallel light, and diverges the light via a surface 423 to be substantially coincident with the beam diameter to the direction of the small beam diameter.

Since it is difficult to manufacture the above-described cylindrical lenses having excellent wavefront aberration and to adjust an optical axis, the method using the cylindrical lenses is rarely used.

In the case of the prism, since a desired beam shaping operation can be done only when substantially parallel light is incident, a separate collimating lens is needed to collimate the diverging light beam output from the laser source, which causes a long light path distance and makes it difficult to manufacture a compact optical pickup.

In the case of the method using the micro-lens, the micro-lens should be assembled in the output window of the laser diode, which makes it difficult to assemble the micro-lens with the laser diode without being a laser diode manufacturer and raises a manufacturing cost. It is also difficult to manufacture a micro-lens having an excellent performance.

SUMMARY OF THE INVENTION

To solve the above problems, it is an object of the present invention to provide a beam-shaping optical system for maximizing a light utilization efficiency and wavefront aberration.

It is another object of the present invention to provide an optical pickup employing the above beam-shaping optical system.

Additional objects and advantages of the invention will be set forth in part in the description which follows and, in part, will be obvious from the description, or may be learned by practice of the invention.

To accomplish the above and other objects of the present invention, there is provided a beam-shaping optical system comprising: a light source; a plurality of plates; and a cylindrical lens disposed between the light source and the plurality of the plates, wherein the system has an optical feature in which the light output from the light source is beam-shaped to have a desired shape in the cross-section of the light beam.

There is also provided an optical pickup for an optical storage medium comprising: a laser source for outputting light having a substantial elliptical cross-section in the form of a divergent beam; a plurality of plates; a cylindrical lens disposed between the laser source and the plurality of plates; and an objective lens for focusing the light incident from the plurality of plates in the optical storage medium, wherein the system has an optical feature in which the light output from the light source is beam-shaped to have a substantially circular shape in the cross-section of the light beam.

BRIEF DESCRIPTION OF THE DRAWINGS

The preferred embodiments are described with reference to the drawings, wherein:

FIGS. 5A and 5B show a beam-shaping optical system according to a first embodiment of the present invention, in which FIG. 5A shows the optical system viewed according to the direction of the large beam diameter of the light output from a laser source, and FIG. 5B shows the optical system viewed according to the direction of the small beam diameter of the light output from the laser source.

DETAILED DESCRIPTION OF THE PREFERRED EMBODIMENT

An optical system and an optical pickup employing the same according to the present invention will be described in detail with reference to the accompanying drawings.

Figure 1:
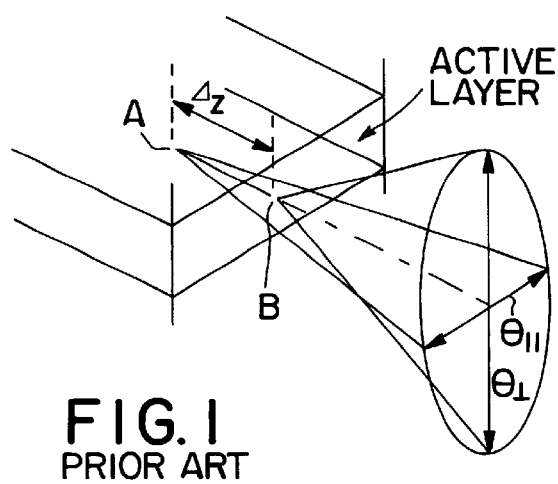
FIG. 1 a view for explaining a laser source for outputting an elliptical light beam.
Figure 2A:
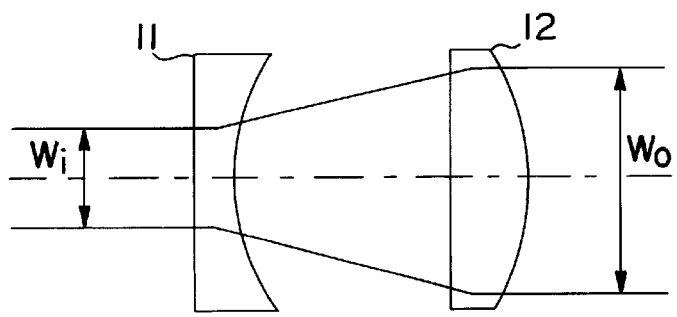
FIGS. 2A and 2B are views for explaining a conventional optical system for shaping a light beam using a cylindrical lens.
Figure 2B:
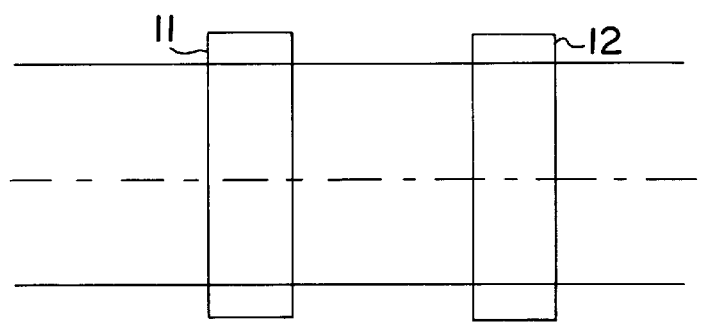
Figure 3:
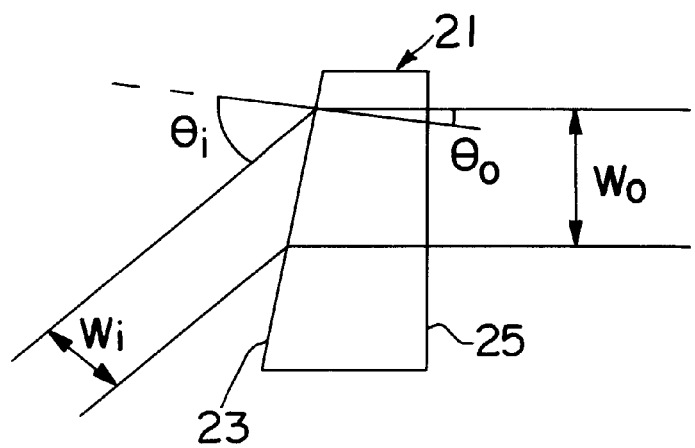
FIG. 3 shows a conventional beam shaping prism.
Figure 4:
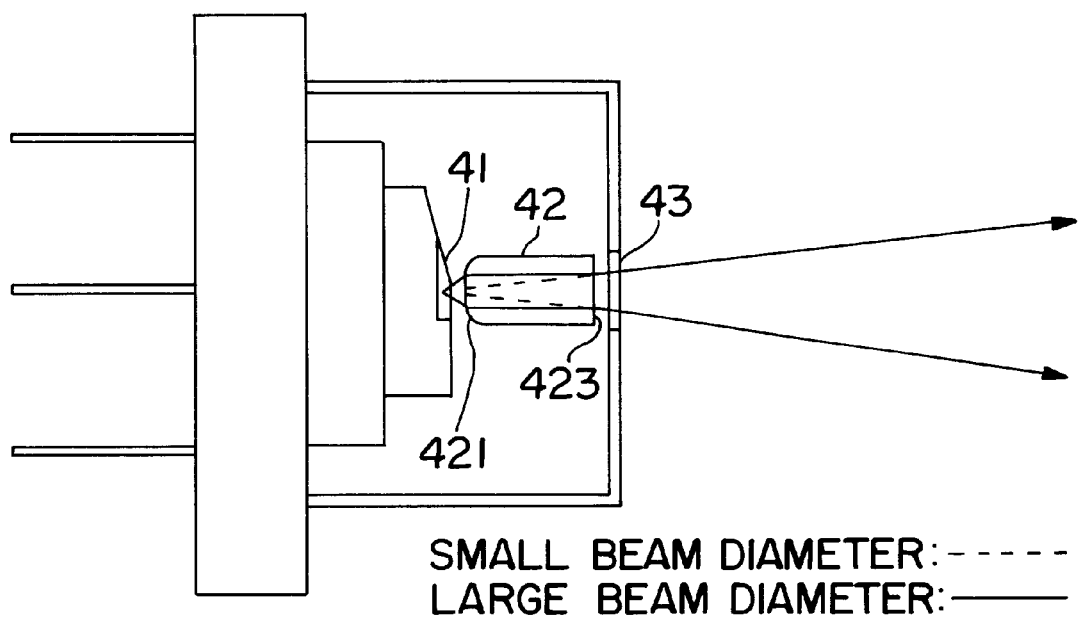
FIG. 4 shows a conventional optical system for shaping a light beam using a micro-lens.
Figure 5A:
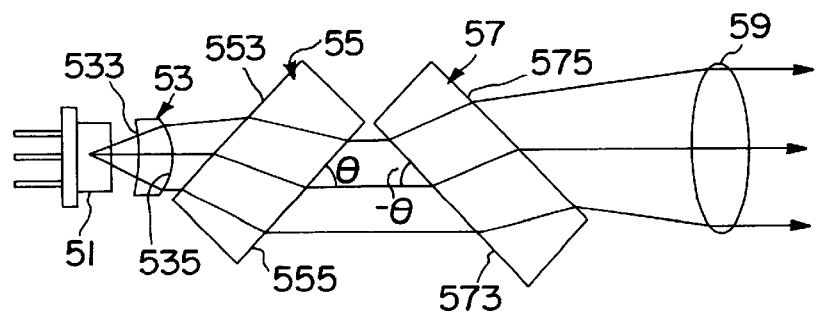
Figure 5B:
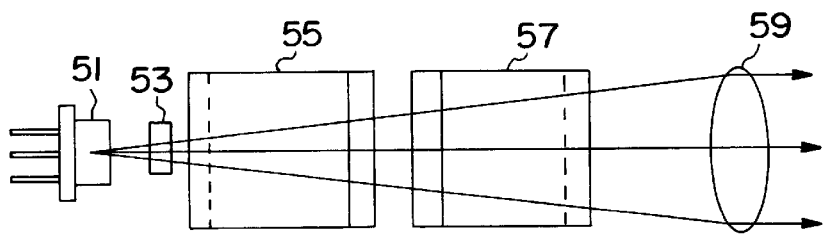

FIGS. 5A and 5B are different views showing an optical system according to an embodiment of the present invention. FIG. 5A shows the optical system viewed according to the direction of the large beam diameter of the light output from a laser source, and FIG. 5B shows the optical system viewed according to the direction of the small beam diameter of the light output from the laser source. The direction of the large beam diameter of the light output from the laser source coincides with the direction ⊥ which has been described with reference to FIG. 1, while the direction of the small beam diameter of the light output from the laser source coincides with the direction ∥ thereof. In optical systems according to the present invention, the elliptical light beam output from the laser source is finally beam-shaped into a substantially circular beam. Therefore, the directions ⊥ and ∥ are used for representation of the directions of the large beam diameter and the small beam diameter of the light output from the laser source.

The optical system includes a cylindrical lens 53, two plates 55 and 57 and a collimating lens 59. A laser diode 51 outputs laser light having a substantial elliptical cross-section in the form of a divergent beam. The laser light is incident to the cylindrical lens 53. The cylindrical lens 53 includes surfaces 533 and 535, whose axis is parallel with the direction ∥. The cylindrical lens 53 is manufactured to have the surface 533 having a negative optical power with respect to the direction ⊥ and the surface 535 having a positive optical power with respect thereto. Then, the optical power of the surface 533 has a relatively minute magnitude compared with the optical power of the surface 535. Since the specific shape and orientation of the cylindrical lens 53 does not limit the present invention, it is possible to modify the cylindrical lens 53 to have an axis parallel with the direction ∥ and surfaces respectively having a bi-convex shape with respect to the direction ⊥.

When a light is incident from the laser diode 51, the cylindrical lens 53 having the above configuration refracts the incident light to reduce the light beam divergency as shown in FIG. 5A with respect to the direction ⊥. However, the cylindrical lens 53 outputs the incident light as it is as shown in FIG. 5B with respect to the direction ∥. Therefore, the divergency with respect to the direction ⊥ is slightly reduced in the light output from the cylindrical lens 53 and the divergency with respect to the direction ∥ is maintained in substantially the same form as that output from the laser diode 51.

The first plate 55, which receives the light from the cylindrical lens 53, is a plane-parallel plate whose surfaces 553 and 555 are parallel with each other. The first plate 55 is disposed to have an inclination angle θ on the basis of the line parallel with an optical axis of the laser diode 51. In a case that the refraction of the light by the cylindrical lens 53 is fixed, the beam diameter with respect to the direction ⊥ and the beam diameter with respect to the direction ∥ can be made to be the same by controlling the inclination angle θ of the first plate 55. However, as is well known, when the first plate 55 is slantingly inserted onto a path of the divergent or convergent light, coma or astigmatism occurs.

The coma can be corrected using plates which are disposed in the crossing form at different positions along the light path. Thus, the second plate 57 including a surface 573 facing the surface 555 of the first plate 55 is used. The second plate 57 is also a plane-parallel plate in which the surface 573 is parallel with the surface 575. The plates 55 and 57 are disposed to have a surface symmetrical relationship with respect to the surface perpendicular to the optical axis. The surface symmetrical relationship is shown in FIG. 5A. Thus, when the first plate 55 is tilted by the angle θ on the basis of the line parallel with the optical axis of the laser diode 51, the second plate 57 is tilted by an angle of −θ. The plates 55 and 57 are manufactured using an optical device having the same refractive index, such as, for example, glass. Meanwhile, the astigmatism generated by insertion of the plates 55 and 57 is compensated by the cylindrical lens 53 used in the optical system. The cylindrical lens 53 also compensates an astigmatic difference described with reference to FIG. 1, that is, an astigmatic difference occurring due to the different starting points at the active layer region of the light output from the laser diode.

The first plate 55 refracts the light incident from the cylindrical lens 53 via the plate surface 553 toward the direction ⊥ of FIG. 5A, and transmits the light without being substantially refracted toward the direction ∥ of FIG. 5B. The second plate 57 also performs the same function as that of the first plate 55. That is, the second plate 57 refracts the light incident from the plate surface 555 of the first plate 55 via the plate surface 573 toward the direction ⊥ of FIG. 5A, and transmits the light without being substantially refracted toward the direction ∥ of FIG. 5B. Therefore, the light transmitted through the first and second plates 55 and 57 becomes a circular light beam in which the beam cross-section of the direction ⊥ is substantially the same as that of the direction ∥, as can be seen from FIGS. 5A and 5B. Also, since the beam shaping is accomplished to be the same as the small beam diameter and not a large beam diameter, the size of an optical spot formed on a signal recording surface of an optical recording medium by the beam-shaped light can be reduced. A collimating lens 59 facing the plate surface 575 of the second plate 57 collimates the divergent light output from the second plate 57. Therefore, if an objective lens is installed in the rear end of the collimating lens 59, a complete optical system which can be used in an optical pickup is manufactured.

The above-described embodiment as shown in FIGS. 5A and 5B has been described with respect to a laser source outputting a light beam having a substantially elliptical cross-section. However, there are various light beams requiring beam shaping including white light or natural light. Accordingly, it is apparent to a person skilled in the art that various modifications for shaping such light beams are possible within the scope of the present invention.

As a modification, the above-described laser diode 51 is replaced by a light source outputting a light beam having a circular cross-section. In this case, the light beam having a circular cross-section is shaped into a light beam having an elliptical cross-section having a long-axis beam diameter and a short-axis beam diameter, one of which may be the same as the output light beam diameter.

As an alternative modification, a light source outputting a light beam having an elliptical cross-section is located in the position of the collimating lens 59. In this case, the light beam having an elliptical cross-section is shaped into a light beam having a circular cross-section which is the same as one of the long-axis beam diameter and the short-axis beam diameter of the elliptical cross-section.

Since these modifications are apparent to one having an ordinary skill in the art, further explanation of these modifications is omitted.

Figure 6:
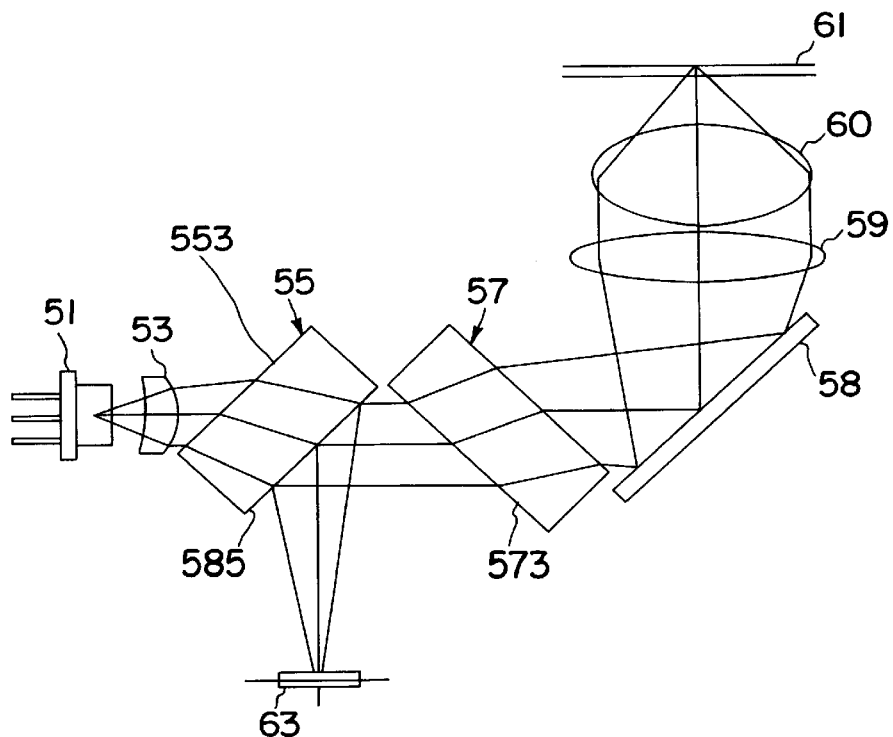
FIG. 6 is a view showing an optical system according to a second embodiment of the present invention.

FIG. 6 is a view showing an optical system employing the above-described embodiment as shown in FIGS. 5A and 5B with various changes. In FIG. 6, the laser diode 51, the cylindrical lens 53 and the second plate 57 are disposed in the same manner as those of FIG. 5A and perform the same functions as those thereof. However, a plate surface 585 of the first plate 55 transmits the light output from the plate surface 553 and reflects the light output from the plate surface 573 of the second plate 57, to function differently from the surface 555 as described with reference to FIG. 5A. That is, the plate surface 585 has a well-known optical feature of a beam splitter. Therefore, the light incident from the second plate surface 573 is reflected by the plate surface 585.

The optical pickup shown in FIG. 6 further includes a reflection mirror 58, an objective lens 60 and a photo detector 63 in addition to the above-described optical devices. The optical pickup of FIG. 6 is disposed so that the optical axis of the laser diode 51 is not parallel with that of the objective lens 60 for focusing the incident light on the signal recording surface of an optical recording medium 61. Also, the reflection mirror 58 is disposed so that the light incident from the second plate 57 is reflected toward the collimating lens 59. Thus, the optical axis of the laser diode 51 is perpendicular to that of the objective lens 60, so that the optical pickup can be compactly manufactured.

The light reflected from the signal recording surface of the optical recording medium 61 transmits through the objective lens 60 and the collimating lens 59 and then is incident to the reflection mirror 58. The light incident to the reflection mirror 58 has a convergent form converged by the collimating lens 59. Accordingly, the light reflected from the reflection mirror 58 and then refracted from the second plate 57 has a convergent form. Thus, the light reflected from the plate surface 585 travels in the convergent form and has astigmatism as well. This is, because the convergent light reflected from the plate surface 585 is light transmitted through only one plate 57 differently from the light which is focused on the signal recording surface of the optical recording medium 61. To use the astigmatism possessed by the light reflected from the plate surface 585 in a focussing servo, the embodiment uses a photo detector 63 having a structure adapted for employing a well-known astigmatic method.

As described above, optical systems according to the embodiments of invention use a cylindrical lens and plates for shaping a light beam, to thereby beam-shape elliptical or circular light output from the light source at low cost. In addition, the beam shaping with respect to the direction of the large beam diameter is performed to coincide with that of the small beam diameter with respect to the elliptical light output from the light source, thereby maximizing a utilization efficiency and a wavefront aberration of the laser light. Also, since the light output from the beam-shaping optical system is diverged and the optical system uses a plurality of plates, the light reflected from the optical recording medium is converged and has astigmatism as it is. As a result, a focussing servo can be performed using the astigmatic method and does not need to use a separate light-receiving lens to converge the light to the photo detector. Further, since an optical axis of the laser source is perpendicular to the optical axis of the objective lens, a compact optical pickup can be accomplished.

While only certain embodiments of the invention have been specifically described herein, it will be apparent that numerous modifications may be made thereto without departing from the spirit and scope of the invention.

What is claimed is:

1. A beam-shaping optical system comprising:

a light source to emit a light beam with first and second cross-section shapes;

a plurality of plates; and a cylindrical lens disposed between said light source and said plurality of plates, wherein the plurality of plates and cylindrical lens beam shapes the light beam output from said light source so as to form a desired shape in the first cross-section of the light beam, while substantially maintaining the second cross-section shape.

2. A beam-shaping optical system comprising:

a light source to emit a light beam;

a plurality of plates; and a cylindrical lens disposed between said light source and said plurality of plates, wherein the plurality of plates and cylindrical lens beam shapes the light beam output from said light source so as to form a desired shape in the cross-section of the light beam having a substantially circular cross-section with a beam diameter, and said plurality of plates and said cylindrical lens shape the light beam output from said light source to have a substantially elliptical cross-section, so that one of a long-axis diameter and a shortaxis diameter of the beam-shaped light beam is the same as the beam diameter of the light beam output from said light source.

3. The beam-shaping optical system according to claim 1, wherein said light source outputs the light beam to have a substantially elliptical beam cross-section with a long-axis diameter and a short-axis diameter, and said plurality of plates and said cylindrical lens shape the light beam output from said light source so that a beam diameter of the beam-shaped light beam has a substantially circular beam cross-section the same as one of the long-axis diameter and the short-axis diameter.

4. A beam-shaping optical system comprising:
   a light source to emit a light beam;
   a plurality of plates; and
   a cylindrical lens disposed between said light source and said plurality of plates
   wherein the plurality of plates and cylindrical lens beam shapes the light beam output from said light source so as to form a desired shape in the cross-section of the light beam having a substantially elliptical beam cross-section with a long-axis diameter and a short-axis diameter, and said plurality of plates and said cylindrical lens shape the light beam output from said light source so that a beam diameter of the beam-shaped light beam has a substantially circular beam cross-section the same as one of the long-axis diameter and the short-axis diameter, and wherein said plurality of plates have a divergency of the light beam on a first reference plane smaller than that on a second reference plane, in which said first reference plane is in parallel with the long-axis diameter of the light beam output from said light source and said second reference plane is in parallel with the short-axis diameter of the light beam output from said light source.

5. The beam-shaping optical system according to claim 4, wherein each of said plurality of plates is a plane-parallel plate which refracts the incident light beam output from said light source.

6. The beam-shaping optical system according to claim 5, wherein said plurality of plates comprises two plates which have a plane symmetrical relationship with respect to a plane perpendicular to an optical axis of said light source and transmit the incident light beam output from said light source.

7. The beam-shaping optical system according to claim 4, wherein said cylindrical lens has a cylindrical surface with a long-axis parallel with said second reference plane and facing said plurality of plates, and said cylindrical surface has a positive optical power.

8. The beam-shaping optical system according to claim 4, wherein said cylindrical lens has a cylindrical surface with a long-axis parallel with said second reference plane and facing said light source, and said cylindrical surface has a negative optical power.

9. The beam-shaping optical system according to claim 4, wherein said cylindrical lens has a first cylindrical surface with a long-axis parallel with said second reference plane and facing said plurality of plates, and said first cylindrical surface has a positive optical power, and a second cylindrical surface with a long-axis parallel with said second reference plane and facing said light source, and said second cylindrical surface has a negative optical power, a nd said negative optical power has a smaller magnitude compared with said positive optical power.

10. An optical pickup for an optical storage medium, comprising:
    a laser source to output a light beam having a substantially elliptical cross-section in a form of a divergent beam;
    a plurality of plates;
    a cylindrical lens disposed between said laser source and said plurality of plates; and
    an objective lens to focus the light beam incident from said plurality of plates in the optical storage medium;
    wherein said plurality of plates and said cylindrical lens beam shape the light beam output from said light source to have a substantially circular shape cross-section.

11. The optical pickup according to claim 10, wherein said plurality of plates and said cylindrical lens beam-shape the light beam having the substantially elliptical cross-section to have a circular beam diameter which is substantially the same as a short-axis diameter of the substantially elliptical light beam.

12. An optical pickup for an optical storage medium comprising:
    a laser source to output a light beam having a substantially elliptical cross-section in a form of a divergent beam;
    a plurality of plates;
    a cylindrical lens disposed between said laser source and said plurality of plates; and
    an objective lens to focus the light beam incident from said plurality of plates in the optical storage medium;
    wherein said plurality of plates and said cylindrical lens beam shape the light beam output from said light source to have a substantially circular shape cross-section, having a circular beam diameter which is substantially the same as a short-axis diameter of the light beam output from said light source, and said plurality of plates have the divergency of the light beam on a first reference plane smaller than that on a second reference plane, in which said first reference plane is in parallel with a long-axis diameter of the light beam output from said light source and said second reference plane is in parallel with the short-axis diameter of the light beam output from said light source.

13. The optical pickup according to claim 12, wherein said plurality of plates which are plane-parallel plates refracts the incident light beam output from said light source.

14. The optical pickup according to claim 13, wherein said plurality of plates comprises two plates which have a plane symmetrical relationship with respect to a plane perpendicular to an optical axis of said light source and transmit the incident light beam output from said light source.

15. The optical pickup according to claim 14, further comprising a photo detector,
    wherein a first one of the plates is located close to said photo detector and reflects the light beam incident from a second one of the two plates located further away from said photo detector toward said photo detector.

16. The optical pickup according to claim 15, wherein said photo detector detects light according to an astigmatic method.

17. The optical pickup according to claim 16, wherein said first plate has a plate surface which is located close to said photo detector and which reflects the light beam incident from said second plate toward said photo detector.

18. The optical pickup according to claim 17, wherein the optical axis of said laser source is not parallel with that of said objective lens and, the optical pickup further comprising a reflection mirror reflecting the light beam incident from said first and second plates toward said objective lens.

19. The optical pickup according to claim 18, wherein the optical axis of said laser source is perpendicular to that of said objective lens.

20. The optical pickup according to claim 12, wherein said cylindrical lens has a cylindrical surface with a long-axis parallel with said second reference plane and facing said plurality of plates, and said cylindrical surface has a positive optical power.

21. The optical pickup according to claim 20, wherein said cylindrical lens has a cylindrical surface with a long-axis parallel with said second reference plane and facing said light source, and said cylindrical surface has a negative optical power.

22. The optical pickup according to claim 21, wherein said cylindrical lens has a cylindrical surface with a long-axis parallel with said second reference plane and facing said light source, and said cylindrical surface has a negative optical power, and said negative optical power has a smaller magnitude compared with said positive optical power.

23. The optical pickup according to claim 10, further comprising a collimating lens to collimate the light beam incident via said plurality of plates and to transmit the light beam to said objective lens.

24. A beam-shaping optical system for beam-shaping a light beam which is output from a light source and has an elliptical beam cross-section, into a substantially circular cross-sectional light beam, the optical system comprising:
a cylindrical lens to receive the light beam having the elliptical cross-section and reduce a beam diameter in a long-axis direction thereof and substantially not change a beam diameter in a short-axis direction thereof; and
a plurality of plates to correct astigmatism of the light beam which is output from said cylindrical lens and output the light beam to have the substantially circular beam cross-section.

25. The beam-shaping optical system according to claim 24, wherein said cylindrical lens has a first cylindrical surface with a long-axis parallel with a short-axis direction of said elliptical light beam and facing said plurality of plates, wherein said first cylindrical surface has a positive optical power.

26. The beam-shaping optical system according to claim 25, wherein said cylindrical lens has a second cylindrical surface with a long-axis parallel with a short-axis direction of said elliptical light beam and facing said light source, wherein said second cylindrical surface has a negative optical power.

27. The beam-shaping optical system according to claim 26, wherein said negative optical power has a smaller magnitude compared with said positive optical power.

28. The beam-shaping optical system according to claim 24, wherein said plurality of plates have a divergency of the light beam on a plane which parallels a long-axis diameter of the light beam output from said light source smaller than that of the light beam on a plane which parallels a short-axis diameter of the light beam output from said light source.

29. The beam-shaping optical system according to claim 28, wherein each of said plurality of plates is a plane-parallel plate refracting the incident light.

30. The beam-shaping optical system according to claim 29, wherein said plurality of plates comprises two plates which have a plane symmetrical relationship with respect to a plane perpendicular to an optical axis of said light source and transmit the incident light beam output from said light source.

31. A beam-shaping optical system comprising:
a light source to emit a diverging light beam;
means for reducing the divergence of the diverging light beam along a first axis diameter of the diverging light beam, while maintaining the divergence of the diverging light beam along a second axis diameter perpendicular to the first axis diameter; and
a plurality of plates to beam-shape the light beam output from said divergence reducing means.

32. The beam-shaping optical system as claimed in claim 31, wherein said divergence reducing means comprises a cylindrical lens.

33. The beam-shaping optical system as claimed in claim 31, wherein:
said light source emits the diverging light beam to have an elliptical cross-section, wherein the first axis diameter and the second axis diameter are long-axis and short-axis diameters, respectively; and
said divergence reducing means and plurality of plates change light beam from having the elliptical cross-section to having a circular cross-section with a diameter approximately equal to the second axis diameter.

34. The beam-shaping optical system as claimed in claim 32, wherein:
said light source emits the diverging light beam to have an elliptical cross-section, wherein the first axis diameter and the second axis diameter are long-axis and short-axis diameters, respectively; and
said cylindrical lens and plurality of plates change light beam from having the elliptical cross-section to having a circular cross-section with a diameter approximately equal to the second axis diameter.

35. The beam-shaping optical system as claimed in claim 31, wherein:
said light source emits the diverging light beam to have a circular cross-section with a diameter, wherein the first axis diameter and the second axis diameter are equal to each other; and
said divergence reducing means and plurality of plates change light beam from having the circular cross-section with the first and second axis diameters equal to each other, to having an elliptical cross-section with a long axis diameter approximately equal to the first and second axis diameters, and a short axis diameter perpendicular to and shorter than the long axis diameter.

36. The beam-shaping optical system as claimed in claim 32, wherein:
said light source emits the diverging light beam to have a circular cross-section with a diameter, wherein the first axis diameter and the second axis diameter are equal to each other; and
said cylindrical lens and plurality of plates change light beam from having the circular cross-section with the first and second axis diameters equal to each other, to having an elliptical cross-section with a long axis diameter approximately equal to the first and second axis diameters, and a short axis diameter perpendicular to and shorter than the long axis diameter.

37. The beam-shaping optical system as claimed in claim 32, wherein said cylindrical lens has parallel surfaces perpendicular to an optical axis of the diverging light beam in a plane coincident with the second axis diameter, has a concave surface to emit the diverging light beam and a convex surface to emit the diverging light beam in a plane coincident with the first axis diameter.

38. A beam-shaping optical system comprising:

a light source to emit a diverging light beam;

means for reducing the divergence of the diverging light beam along a first axis diameter of the diverging light beam, while maintaining the divergence of the diverging light beam along a second axis diameter perpendicular to the first axis diameter; and a plurality of plates to beam-shape the light beam output from said divergence reducing means;

wherein said divergence reducing means comprises a cylindrical lens, and said cylindric lens has parallel surfaces perpendicular to an optical axis of the diverging light beam in a plane coincident with the second axis diameter, has a first convex surface to emit the diverging light beam and a second convex surface to emit the diverging light beam in a plane coincident with the first axis diameter.

39. The beam-shaping optical system as claimed in claim 31, wherein said divergence reducing means compensates for an astigmatism of the beam-shaped light beam which is to be output from said plurality of plates.

40. The beam-shaping optical system as claimed in claim 32, further comprising a collimating lens to collimate the beam-shaped light beam output from said plurality of plates.

41. The beam-shaping optical system as claimed in claim 40, further comprising:

an objective lens to focus the collimated beam-shaped light beam on an optical disk, and transmit the collimated beam-shaped light beam reflected from the optical disk; and a photo detector;

wherein said plurality of plates comprises first and second plates having a plane symmetrical relationship with respect to a plane perpendicular to an optical axis of said light source, said collimating lens converges the reflected light beam transmitted through said objective lens, said second plate refracts the converged reflected light beam, and said first plate has a surface closest to said second plate, which reflects the refracted converged reflected light beam toward said photo detector.

42. The beam-shaping optical system as claimed in claim 41, further comprising a reflection mirror to reflect the beam-shaped light output from said second plate toward said collimating lens, and to reflect the converged reflected light beam from said collimating lens toward said second plate.

43. The beam-shaping optical system as claimed in claim 34, wherein said light source comprises a laser diode having a junction surface, wherein the first axis diameter is perpendicular to a direction of the junction surface and the second axis diameter is parallel to the direction of the junction surface.

44. The beam-shaping optical system as claimed in claim 36, wherein said light source comprises a laser diode having a junction surface, wherein the first axis diameter is perpendicular to a direction of the junction surface and the second axis diameter is parallel to the direction of the junction surface.

45. A beam-shaping optical system comprising:

a light source to emit a diverging beam with first and second cross-section shapes;

a plurality of plates to beam-shape the diverging light beam output; and means, placed between said light source and said plurality of plates, for compensating for astigmatism to be generated by the beam-shaping of the plurality of plates wherein the plurality of plates and means for compensating for astigmatism beam-shape the first cross-section shape, while substantially maintaining the second cross-section shape.

* * * * *